(12) United States Patent
Kim et al.

(10) Patent No.: US 7,278,082 B2
(45) Date of Patent: Oct. 2, 2007

(54) METHOD OF GENERATING PARITY DATA BASED ON LOW-DENSITY PARITY CHECK MATRIX AND APPARATUS THEREFOR

(75) Inventors: Ki-hyun Kim, Gyeonggi-do (KR); Sung-hyu Han, Seoul (KR); In-sik Park, Gyeonggi-do (KR); Yoon-woo Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 627 days.

(21) Appl. No.: 10/765,278

(22) Filed: Jan. 28, 2004

(65) Prior Publication Data

US 2004/0255222 A1  Dec. 16, 2004

(30) Foreign Application Priority Data

Jan. 29, 2003  (KR) ............... 10-2003-0005927

(51) Int. Cl.
*H03M 13/00* (2006.01)
(52) U.S. Cl. ............ 714/752; 714/758; 714/704; 714/759
(58) Field of Classification Search ........ 714/752, 714/758, 800, 704, 790, 801, 759, 776, 781
See application file for complete search history.

(56) References Cited

U.S. PATENT DOCUMENTS

| | | | |
|---|---|---|---|
| 3,728,678 A * | 4/1973 | Tong ............ | 714/787 |
| 6,405,343 B1 | 6/2002 | Chiang | |
| 6,928,602 B2 * | 8/2005 | Yamagishi et al. ...... | 714/781 |
| 7,000,177 B1 * | 2/2006 | Wu et al. ............ | 714/801 |
| 7,020,826 B2 * | 3/2006 | Litwin et al. ......... | 714/784 |
| 7,143,333 B2 * | 11/2006 | Blankenship et al. ..... | 714/781 |
| 2003/0104788 A1 * | 6/2003 | Kim ................ | 455/67.3 |

OTHER PUBLICATIONS

Sridhar, N., et al., "Algorithms for the structural diagnosis and decomposition of sparse, underconstrained design systems", Computer-Aided Design, vol. 28, No. 4, Apr. 1996, pp. 237-249.
Cheung, L. K., et al., "The Bordered Triangular Matrix and Minimum Essential Sets of a Digraph", IEEE Transactions on Circuits and Systems, vol. CAS-21, No. 5, Sep. 1974, pp. 633-639.
Zhang, T., et al., "A Class of Efficient-Encoding Generalized Low-Density Parity-Check Codes", Proc., IEEE Inter. Conference on Acoustics, Speech, and Signal Processing, ICASSP '01, vol. 4, May 2001, pp. 2477-2480.
Richardson, T. J., et al., "Efficient Encoding of Low-Density Parity-Check Codes", IEEE Transactions of Information Theory, IEEE Inc., vol. 47, No. 2, Feb. 2001, pp. 638-656.

* cited by examiner

*Primary Examiner*—Guy Lamarre
*Assistant Examiner*—Fritz Alphonse
(74) *Attorney, Agent, or Firm*—Stein, McEwen & Bui, LLP

(57) ABSTRACT

A method of generating parity data based on a low-density panty check matrix and an apparatus therefor, the method including: reordering columns of the parity check matrix based on elements in each column having values of one to generate a reordered parity check matrix; determining a cross-point between a diagonal line of a parity matrix part in the parity check matrix and a reordered diagonal line defined by a first entry of an element having a value of one in each column of the reordered parity check matrix; and performing column permutations on the reordered parity check matrix on the basis of positions of elements having a value of one in rows above a horizontal line that passes through the cross-point to generate a triangular matrix, thus reducing the computations required to generate parity data, thereby efficiently obtaining the parity data.

30 Claims, 7 Drawing Sheets

METHOD OF GENERATING PARITY DATA BASED ON LOW-DENSITY PARITY CHECK MATRIX AND APPARATUS THEREFOR

CROSS-REFERENCE TO RELATED APPLICATIONS

This application claims the benefit of Korean Patent Application No. 2003-5927, filed on Jan. 29, 2003, in the Korean Intellectual Property Office, the disclosure of which is incorporated herein by reference.

BACKGROUND OF THE INVENTION

1. Field of the Invention

The present invention relates to a method of error correction and signal detection, and more particularly to, a method of generating parity data based on low-density parity check matrices and an apparatus therefor.

2. Description of the Related Art

A conventional coding method based on Low Density Parity Check (LDPC) codes for error correction generates parity check codes that have a predetermined number of elements having a value of one in rows and columns of the parity check codes, and then generates parity data based on the parity check codes.

That is, in the coding method based on the LDPC codes, a parity check matrix H having a predetermined number of elements having a value of one in its rows and columns is formed, and a codeword x satisfying the equation $Hx=0$ is obtained.

The codeword x includes original data and parity data.

In order to obtain the parity data, the parity check matrix H is converted into a generator matrix G by Gaussian elimination, or into a lower triangular form. Since the generator matrix G is no longer a sparse matrix, increased computational time is required for calculating the codeword x.

A conventional parity check code matrix H of the form $$\begin{bmatrix} A & B & T \\ C & D & E \end{bmatrix}$$

is shown in FIG. 1.

To obtain the codeword x satisfying the equation $Hx=0$, triangulation of the parity check code matrix H is performed, and then pre-multiplication using Gaussian elimination is carried out, as shown in the following equation (1).

$$\begin{bmatrix} I & 0 \\ -ET^{-1} & I \end{bmatrix} \begin{bmatrix} A & B & T \\ C & D & E \end{bmatrix} = \begin{bmatrix} A & B & T \\ -ET^{-1} & A+C-ET^{-1}B+D & 0 \end{bmatrix} \quad (1)$$

However, the above calculation process is highly complex and time consuming.

The basic concept of the LDPC is described by D. J. Mackay, in "Good Error-Correction Codes Based on Very Sparse Matrices", IEEE Trans. on Information Theory, vol. 45, No. 2, pp. 399-431, 1999, and a conventional implementation of the H matrix is presented by T. Richardson and R. Urbanke in "Efficient Encoding of Low-Density Parity-Check Codes", IEEE Trans. on Information Theory, vol. 47, No. 2, pp. 638-656, 2001.

SUMMARY OF THE INVENTION

The present invention provides a method of efficiently generating parity data based on low-density parity check matrices and an apparatus therefor.

In accordance with an aspect of the present invention, a method of generating parity data is provided based on a parity check matrix H having p codewords of length c, each codeword being divided in a message word of length m and parity data of length p. The method includes reordering columns of the parity check matrix H based on elements in each column having values of one to generate a reordered parity check matrix H', determining a cross-point I between a diagonal line L2 of a parity matrix part Mp in the parity check matrix H' and a reordered diagonal line L1 defined by a first entry of an element having a value of one in each column of the reordered parity check matrix H' in rows above a horizontal line L3 that passes through the cross-point I to perform column permutations on the reordered parity check matrix H' to generate a triangular matrix T. The method further includes using the triangular matrix T and the message words to obtain the parity data and satisfying the equation $Hx=0$, where x is a codeword matrix, to obtain the remaining parity data.

According to an aspect of the invention, the reordering columns of the parity check matrix H based on elements in each column includes finding a first entry of an element having a value of one in each column in the parity check matrix H, and reordering the columns from left to right in the order of the highest entry of an element having a value of one in each column.

According to an aspect of the invention, the determining a cross-point I includes, with regard to elements above the horizontal line L3, sequentially exchanging from left to right columns of a message matrix part Mm with columns of the parity matrix part Mp in the reordered parity check matrix H'.

According to an aspect of the invention, the using the triangular matrix T and the message words to obtain the parity data is performed by a backward-substitution method.

According to an aspect of the invention, the satisfying the equation $Hx=0$ to obtain the remaining parity data is performed by a Gaussian elimination method.

In accordance with another aspect of the present invention, a method of generating parity information is provided based on a parity check matrix H having p codewords of length c, each codeword being divided in a message word of length m and parity data of length p. The method comprises reordering columns in the parity check matrix H based on elements in each column having values of one to obtain a reordered parity check matrix H', determining a cross-point I between a diagonal line L2 of a parity matrix part Mp that corresponds to a parity information part in the parity check matrix H' and a reordered diagonal line L1 defined by a first entry of an element having a value of one in each column of the reordered parity check matrix H', and, on the basis of positions of elements having a value of one in rows above a horizontal line L3 that pass through the cross-point I to perform column permutations on the reordered parity check matrix H', forming a triangular matrix T. The method further includes, for rows under-the horizontal line L3, performing row and column permutation based on the positions of the elements having a value of one in the rows to form an extended triangular matrix T, and using the extended triangular matrix T and the message words to obtain the parity data.

According to an aspect of the present invention, the using the triangular matrix T and the message words to obtain the parity data includes checking whether there is a row under the horizontal line L3, in which a second element from right to left having a value of one is on the left of the diagonal line L2 of the parity matrix part Mp in the reordered parity check matrix H', and if such a row exists, exchanging the row with a top-most row under the horizontal line L3 and exchanging a first column having an element having a value of one in the new exchanged top-most row to the right of the diagonal line L2 with a second column having an element having a value of one in the newly exchanged top-most row to the nearest left of the diagonal line L2. According to an aspect of the present invention, these operations are repeatedly performed until a row no longer exists, in which a second element from right to left having a value of one is to the left of the diagonal line L2.

According to an aspect of the present invention, the using the extended triangular matrix T and the message words to obtain the parity data includes generating a part of the parity data using the extended triangular matrix and the message words. According to an aspect of the present invention, the generating is performed by backward-substitution calculation.

According to an aspect of the present invention, the using the extended triangular matrix T and the message words to obtain the parity data includes generating remaining parts of parity data by Gaussian elimination.

In accordance with yet another aspect of the present invention, an apparatus is provided for generating parity information based on a parity check matrix H having p codewords of length c, each codeword being divided into a message word of length m and parity data of length p. The apparatus includes a parity check matrix generator for reordering columns in the parity check matrix H, based on elements in each column having a value of one to generate a reordered parity check matrix H', a triangular matrix generator for determining a cross-point I between a diagonal line L2 of a parity matrix part Mp in the parity check matrix H' and a reordered diagonal line L1 defined by a first entry of an element having a value of one in each column of the reordered parity check matrix H', and, on the basis of positions of elements having a value of one in rows above a horizontal line L3 that passes through the cross-point I to perform column permutations on the reordered parity check matrix H', for generating a triangular matrix T1. The apparatus also includes a calculator for using the triangular matrix T and the message words to obtain the parity data and a calculator to find values for satisfying the equation Hx=0, where x is a codeword matrix, to obtain the remaining parity data.

According to an aspect of the present invention, the parity check matrix generator for reordering columns finds a top position of an element having a value of one in each column in the parity check matrix H, and reorders columns from left to right in the order of highest entry of the element having a value of one in each column.

According to an aspect of the present invention, the triangular matrix generator for determining a cross-point I and using positions of elements having a value of one sequentially exchanges from left to right columns of a message matrix part Mm with columns of the parity matrix part Mp in the reordered parity check matrix H', with regard to positions of an element with respect to the horizontal line L3.

According to an aspect of the present invention, the calculator for using the triangular matrix T and the message words generates parity data by backward-substitution calculation using the triangular matrix T.

According to an aspect of the present invention, the triangular matrix generator for determining a cross-point I and for using positions of elements having a value of one generates the parity data by Gaussian elimination.

According to still another aspect of the present invention, an apparatus is provided for generating parity information based on a parity check matrix H having p codewords of length c, each codeword being divided into a message word of length m and parity data of length p. The apparatus includes a parity check matrix generator for reordering columns in the parity check matrix H, based on elements in each column having values of one to generate a reordered parity check matrix H', a triangular matrix generator for determining a cross-point I between a diagonal line L2 of a parity matrix part Mp in the parity check matrix H and a reordered diagonal line L1 defined by first entry of an element having a value of one in each column of the reordered parity check matrix H', and, on the basis of positions of elements having a value of one in rows above a horizontal line L3 that passes through the cross-point I to perform column permutations on the reordered parity check matrix H' to generate a triangular matrix T. The apparatus also includes a column permutator for performing row and column permutation based on the positions of elements having a value of one in the rows to form an extended triangular matrix T, for rows under the horizontal line L3, and a calculator calculating values using the extended triangular matrix T and the message words to generate the parity data.

According to an aspect of the present invention, the column permutator for performing row and column permutation includes a checker for checking whether there is a row under the horizontal line L3, in which a second element from right to left having a value of one in the row is on the left of the diagonal line L2 of the parity matrix part Mp in the reordered parity check matrix H', a first exchanger for exchanging the row with a top-most row under the horizontal line L3, and a second exchanger for exchanging a first column having an element having a value of one in the newly exchanged top-most row on the right of the diagonal line L2 with a second column having an element having a value of one in the same top-most row on the nearest left of the diagonal line L2.

According to an aspect of the present invention, the calculator calculating values using the extended triangular matrix T includes a calculator to generate part of parity data by a backward substitution calculation using the extended triangular matrix and the message words.

According to an aspect of the present invention, the calculator calculates values using the extended triangular matrix T to generate remaining parity data by Gaussian elimination.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings in which.

DETAILED DESCRIPTION OF THE INVENTION

Figure 1:
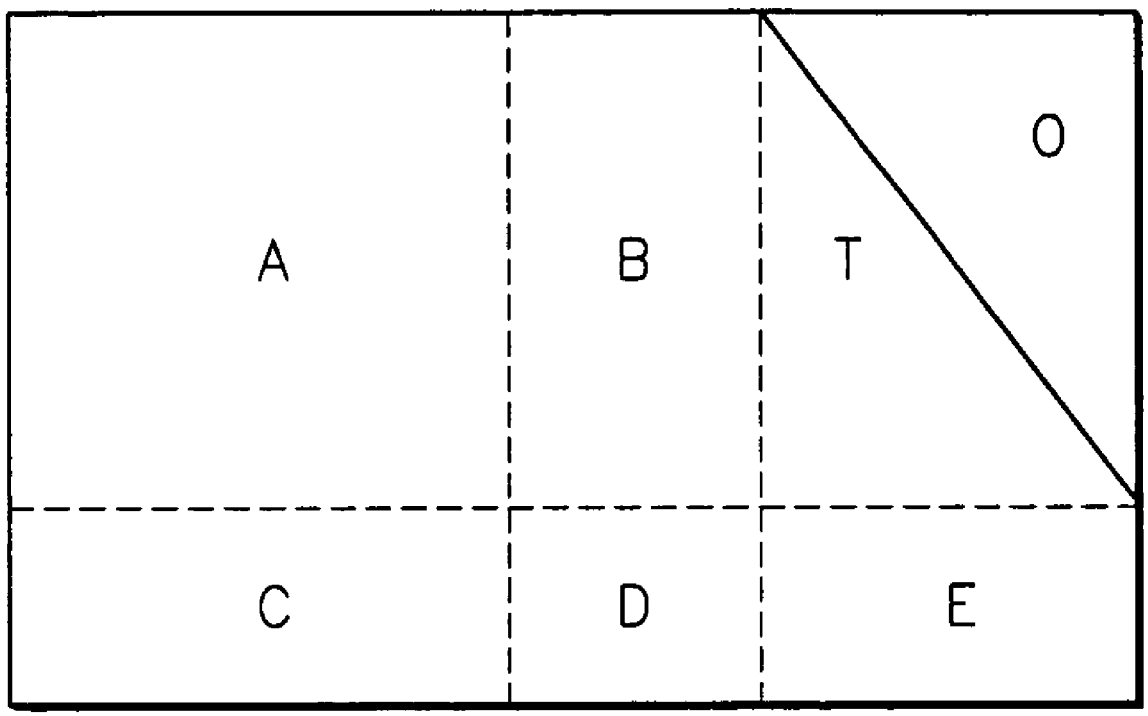
FIG. 1 shows a conventional structure of an H matrix used to obtain parity for error correction.

Reference will now be made in detail to the embodiments of the present invention, examples of which are illustrated in the accompanying drawings, wherein like reference numerals refer to the like elements throughout. The embodiments are described below to explain the present invention by referring to the figures.

Aspects of the present invention are embodied in many different forms and should not be construed as being limited to the embodiments set forth herein; rather these embodiments are provided so that this disclosure conveys a description of some aspects of the invention to those skilled in the art.

According to an aspect of the present invention, the modification to a parity check matrix is restricted to column or row permutation.

Even if all columns or rows are exchanged, separate equations are formed using the parity check matrix, so that the column or row permutation does not affect generation of parity data.

Figure 2:
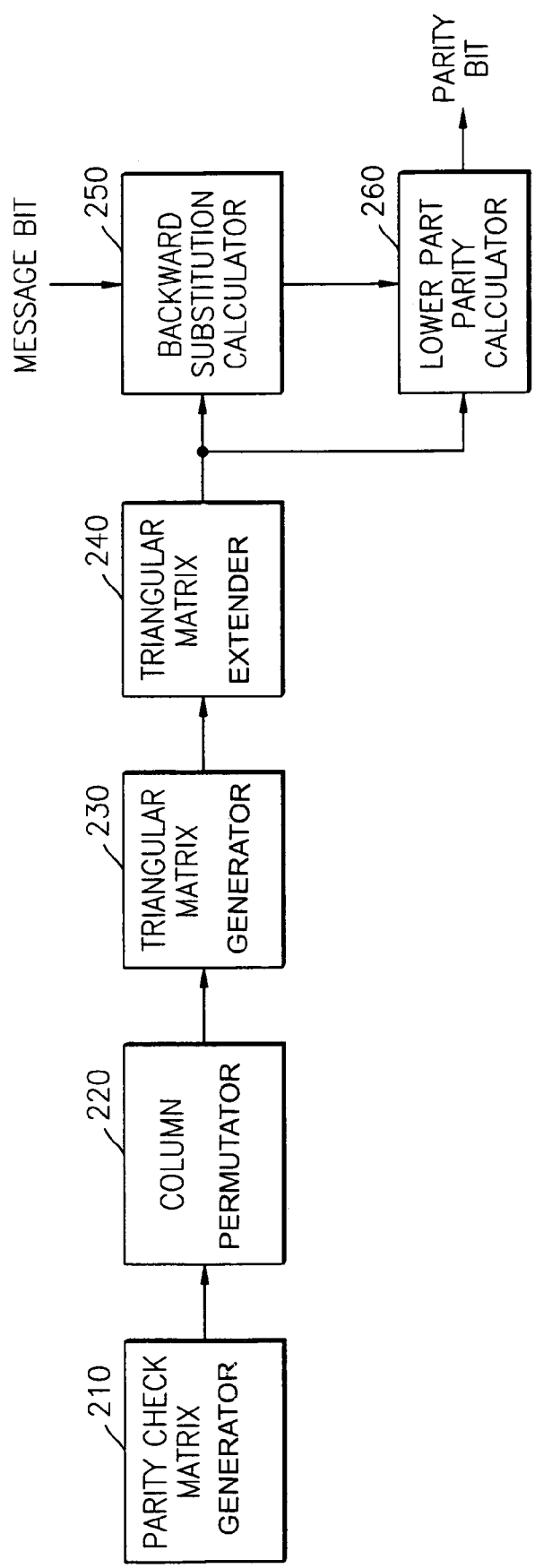
FIG. 2 is a block diagram of an aspect of an apparatus for generating parity data based on low-density parity check matrices, according to an aspect of the present invention.

FIG. 2 is a block diagram of an aspect of the present invention of an apparatus for generating parity data based on low-density parity check matrices.

The apparatus includes a parity check matrix generator 210, a column permutator 220, a triangular matrix generator 230, a triangular matrix extender 240, a backward substitution calculator 250, and a lower part parity calculator 260.

Operations of the apparatus of FIG. 2 will now be described with reference to FIGS. 3A through 3C in conjunction with FIGS. 4A through 4D.

Referring to FIG. 2, the parity check matrix generator 210 generates a parity check matrix H with p rows, corresponding to a length of parity data, and c columns, corresponding to a length of a codeword.

Elements of the parity check matrix H have values of zero or one, and the number of elements having a value of one is less than that of the number of elements having a value of zero The column permutator 220 reconstructs the parity check matrix H generated by the parity check matrix generator 210 by reordering the columns from left to right such that the upper most elements having values of one in each column are arranged, for example, along a diagonal line L1.

Figure 3A:
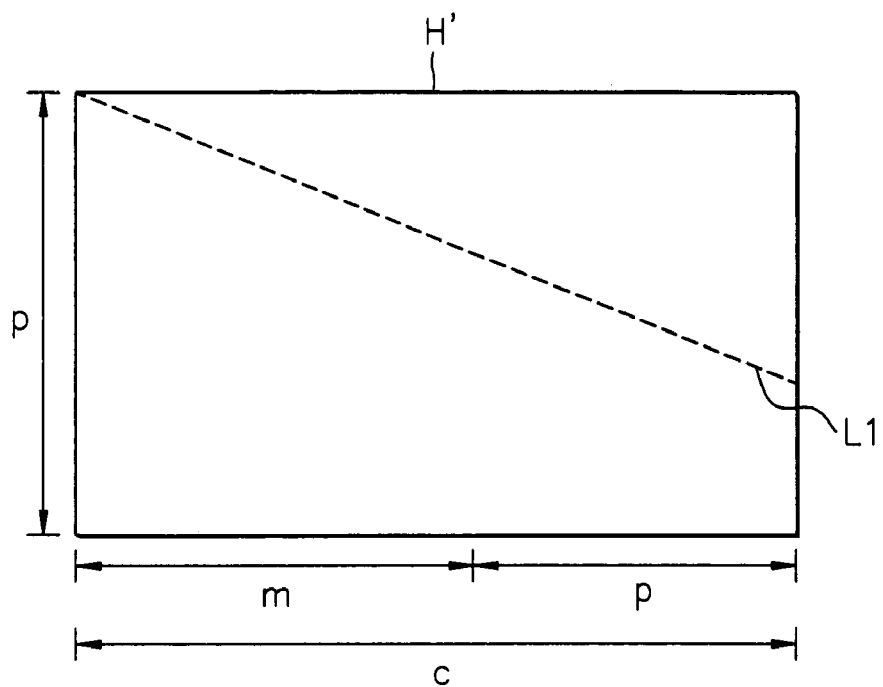
FIGS. 3A through 3C illustrate how the parity check matrix is re-structured by a column permutation unit of FIG. 2.

In other words, in FIG. 3A, column permutation is performed such that columns having a higher first entry of an element having a value of one are arranged from left to right.

For example, a dotted line L1 in FIG. 3A represents a reordered diagonal line that connects the upper-most positions of elements having a value of one in the reordered columns.

Figure 3B:
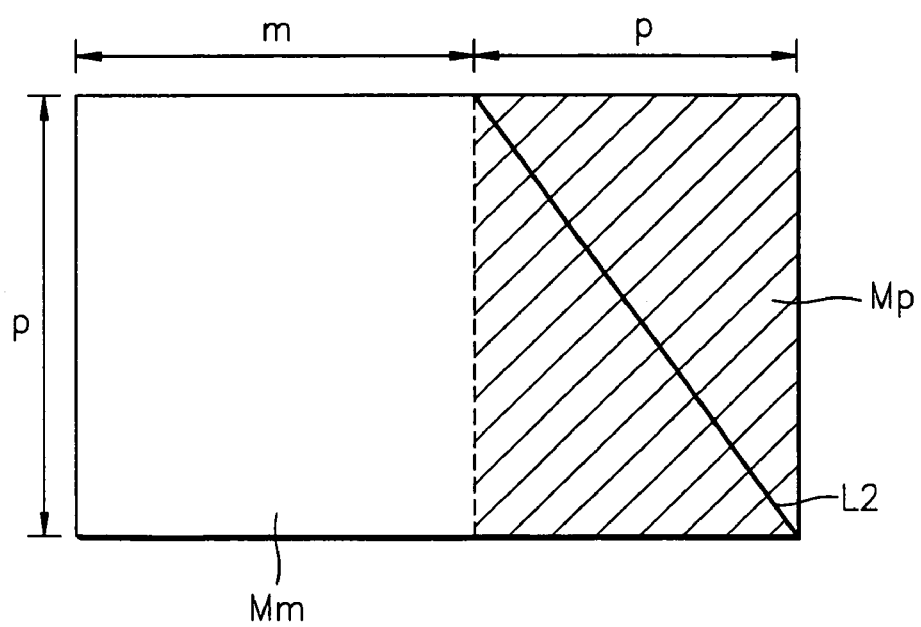

FIG. 3B shows the reordered parity check matrix H'. The reordered parity check matrix H' is divided into a message matrix part Mm having p message words, the length of each message word being m in a horizontal direction, and a parity matrix part Mp having p parities, the length of each parity being p in a horizontal direction.

A diagonal line L2 in the parity matrix part Mp represents a line that connects diagonal elements in the parity matrix part Mp. FIG. 3C shows the column permutation process by the triangular matrix generator 230.

Figure 4A:
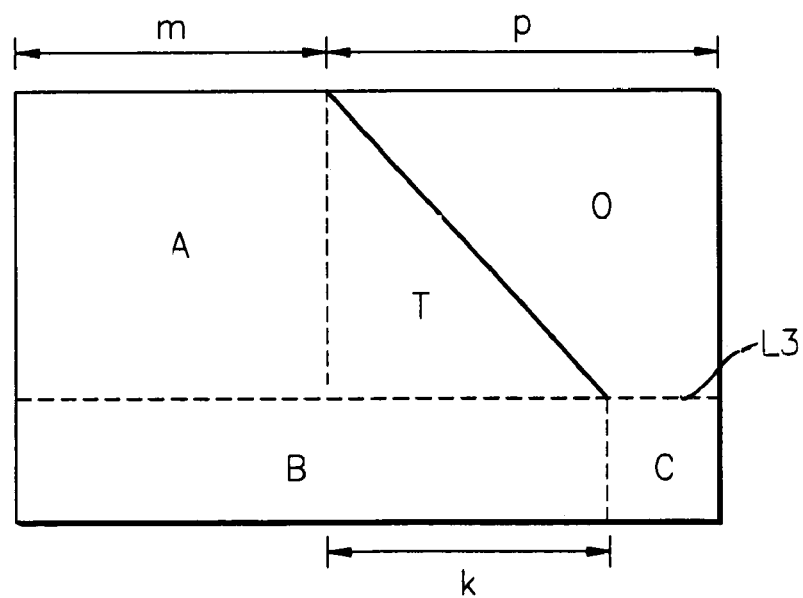
FIGS. 4A through 4D show parity check matrices H for generating parity data, according to an aspect of the present invention.

The triangular matrix generator 230 forms a triangular matrix T as shown in FIG. 4A, by performing column permutation on the reordered parity check matrix H'.

Figure 3C:
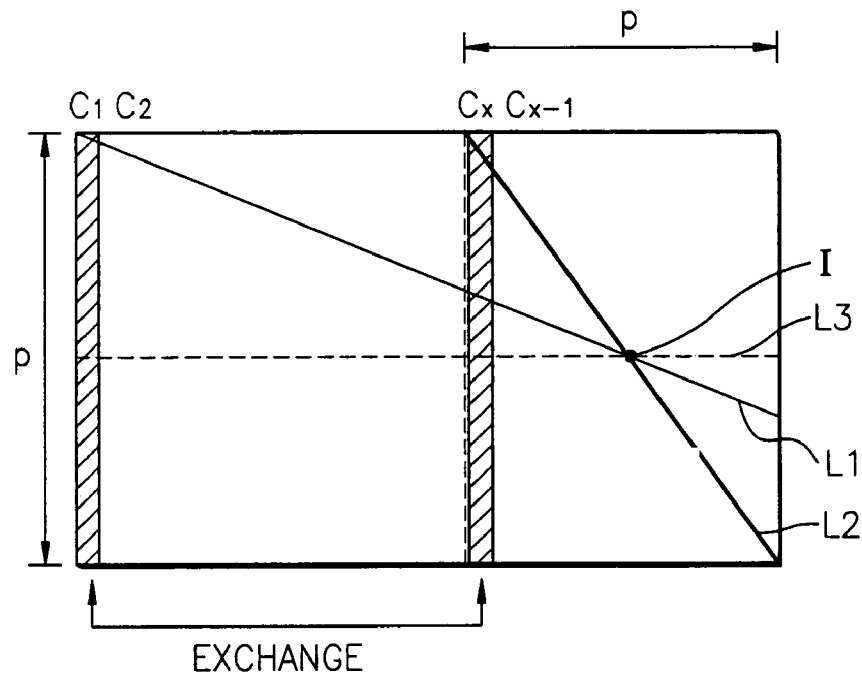

In FIG. 3C, a solid line L1 represents the same reordered diagonal line L1 shown in FIG. 3A, another solid line L2 represents the same diagonal line L2 of the parity matrix part shown in FIG. 3B, and an index I represents a cross-point of L1 and L2.

A dotted line L3 is a horizontal line that passes through the cross-point 1.

In column permutation, the first column exchange is performed between the leftmost columns of the message matrix part Mm and the parity matrix part Mp.

That is, first columns C1 and Cx are exchanged first, then columns C2 and Cx–1 are exchanged, and so on. The resulting triangular matrix T is shown in FIG. 4A.

FIG. 4A shows the parity check matrix that includes the triangular matrix T. An upper-right part of the triangular matrix T contains elements having only a value of zero, an upper part of remaining columns resulted from excluding the permutated k columns from p columns in the parity matrix part Mp with respect to the horizontal line L3 containing elements having a value of zero, and a lower part of the remaining columns with respect to the horizontal line L3 defines a matrix C of the parity check matrix and includes elements having a value of zero and one.

Figure 4B:
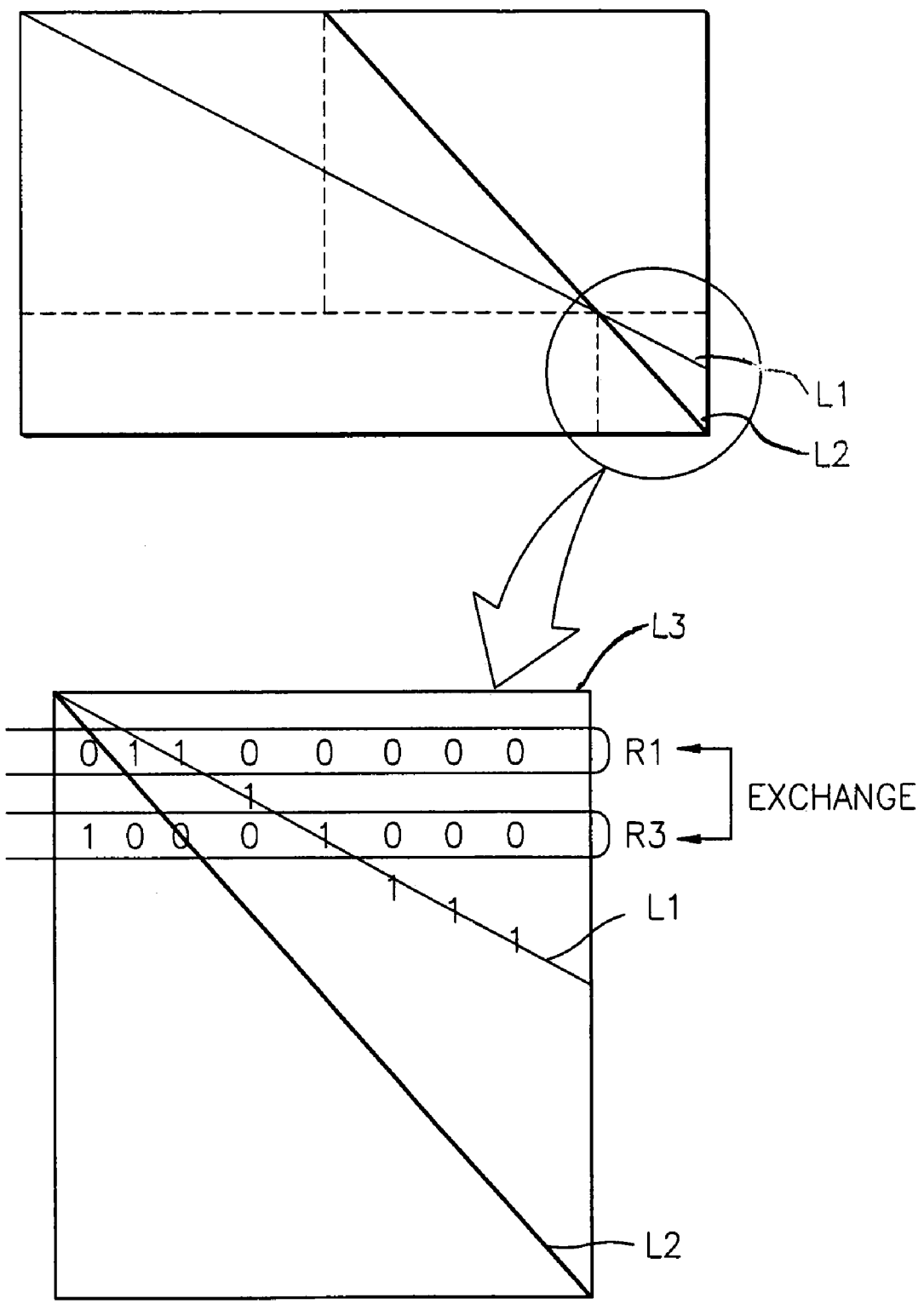
Figure 4C:
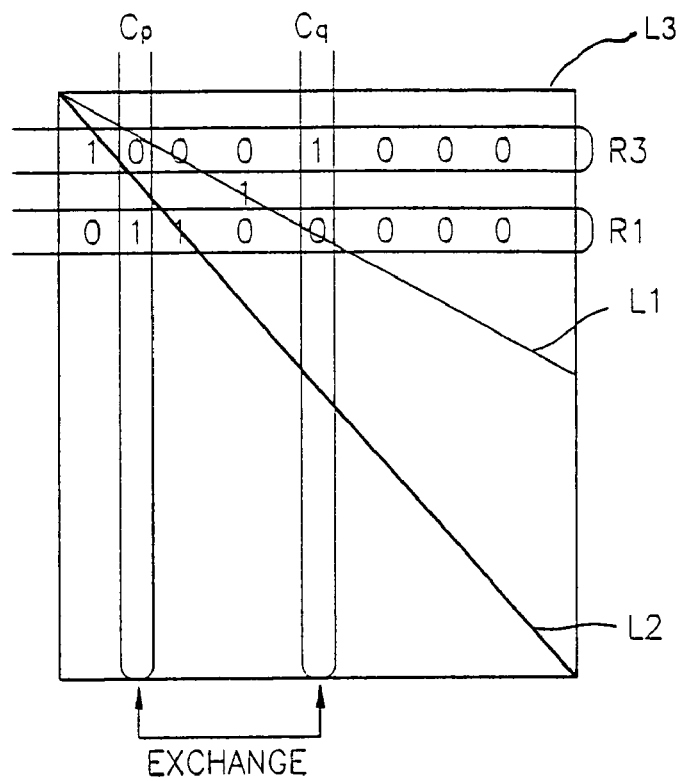

The triangular matrix extension unit 240 sequentially performs a plurality of row permutations and column permutations as shown in FIGS. 4B and 4C to diagonalize the un-diagonalized matrix C to the maximum possible extent.

FIGS. 4B and 4C show the row and column permutation processes performed by the triangular matrix extension unit 240.

Referring to FIG. 4B, comparing all the rows under the horizontal line L3, a row in which a second element from right to left of all elements having a value of one to the left of the diagonal line L2 is extracted, e.g., row R3 in FIG. 4B, and exchanged with a row R1, i.e., the upper-most row under the horizontal line L3. If there is no row meeting the condition that the second element having a value of one from the right end of the matrix is to the left of the diagonal line L2, the triangular matrix extension process performed by the triangular matrix extender 240 is finished.

Thereafter, as shown, for example, in FIG. 4C, a column Cq having an element with a value of one in the row R3 to the right of the diagonal line L2, is exchanged with a column Cp having an element with a value of one in the row R3 to the left of the diagonal line L2.

If there is no column having an element with a value of one in the row in an extracted row to the right of the diagonal line L2 column permutation is no longer performed, and the triangular extension process is stopped.

The row and column permutations are repeatedly performed until a row no longer exists in which a second element from right to left having a value of one is on the left of the diagonal line L2, and thereby the lower part of the triangular matrix T is extended as much as possible so as to make the matrix C of the parity check matrix as small as possible.

Figure 4D:
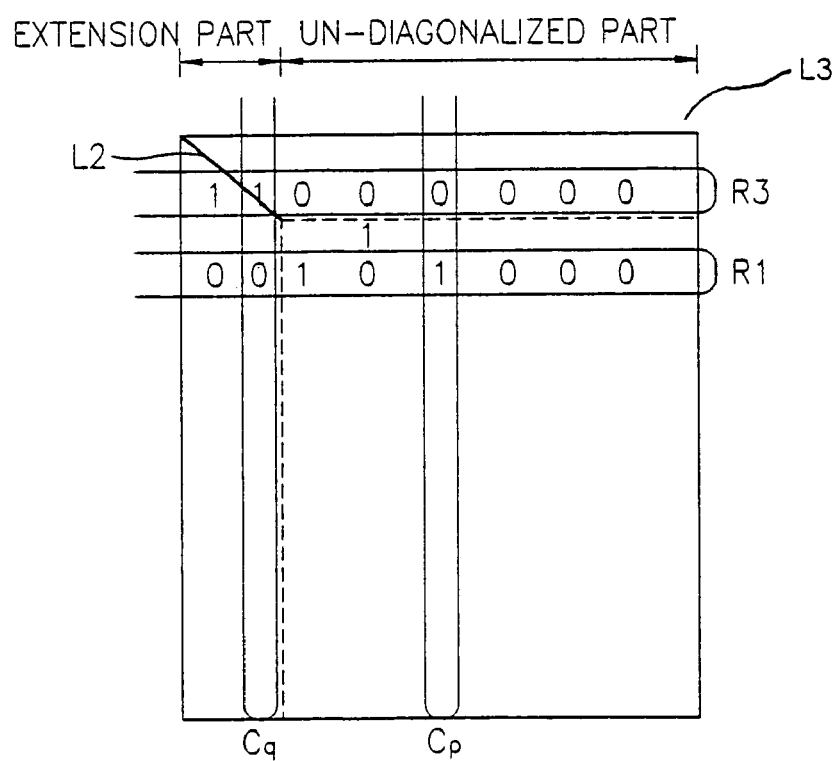

FIG. 4D shows a part of the triangular matrix extended by the triangular matrix extension unit 240.

Since a single column has been exchanged according to the aspect of the present invention shown in FIGS. 4B and 4C, the triangular matrix T is extended by 1×1 bits in horizontal and vertical directions.

The backward-substitution calculator 250 performs a backward substitution calculation using message bits and the area of the triangular matrix extended by the triangular matrix extension unit 240, thereby obtaining values of parity bits (or parity data). This calculation is represented by the following equation (2).

$$P_l = -\sum_{j=1}^{n-m} H_{l,j} S_j - \sum_{j=1}^{l-1} H_{l,j+n-m} P_j \qquad (2)$$

By satisfying equation (2), k parity bit's values of the whole parity bit's values are obtained.

The lower part parity calculator 260 obtains parity bit values of the un-diagonalized part using Gaussian elimination or equation (1). Since the parity bits, excluding k parity bits obtained by the backward-substitution calculator 250 from p parity bits, are excluded in constructing the triangular matrix T by the triangular matrix extension unit 240, a matrix such as matrix C shown in FIG. 4a is a reduced form of the original matrix H.

Figure 5:
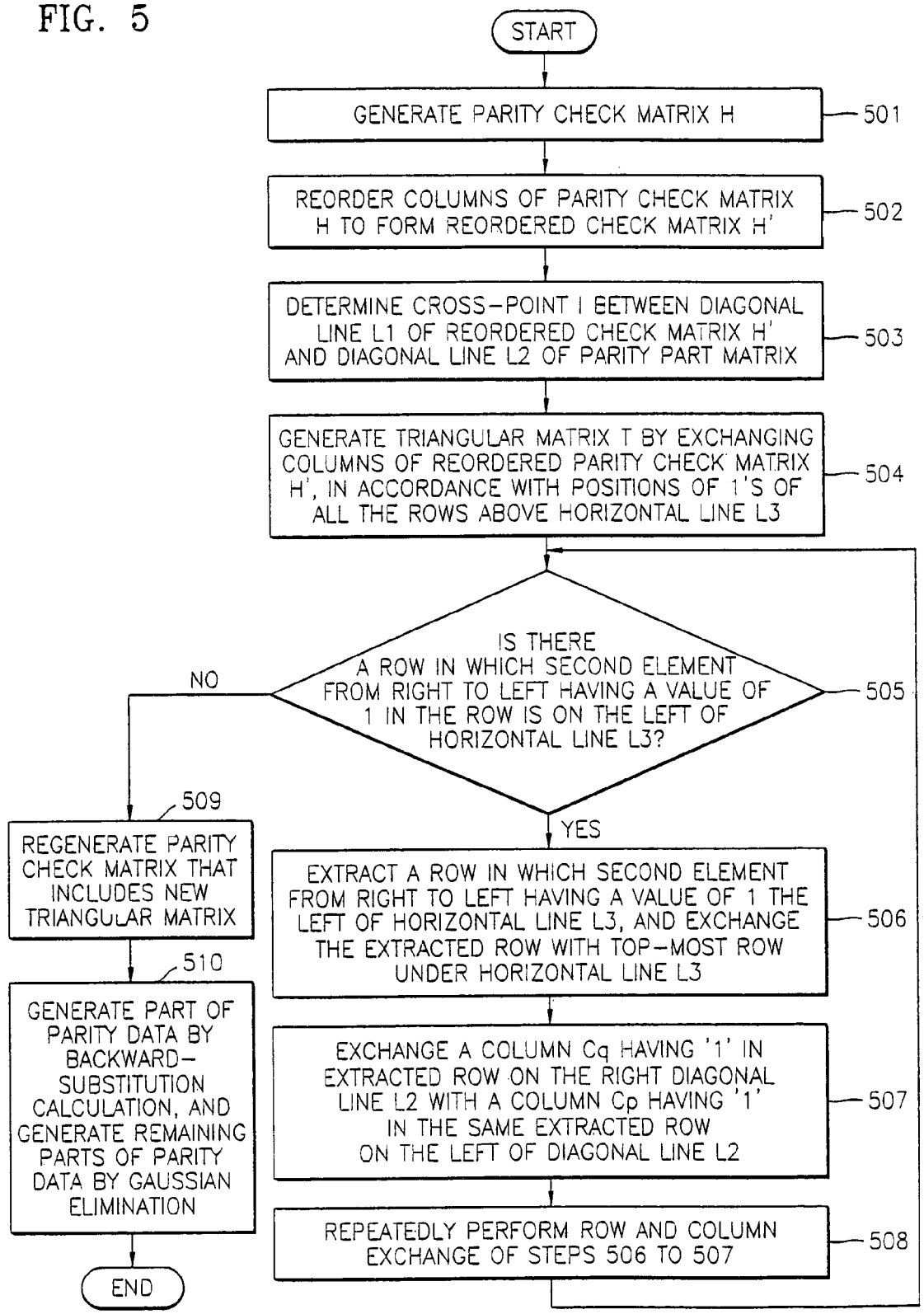
FIG. 5 is a flowchart of a method of generating parity data based on low-density parity check matrices, according to an aspect of the present invention.

FIG. 5 is a flowchart of a method of generating parity data based on the low-density parity check matrix, which will be described in conjunction with FIG. 2.

The parity check matrix generator 210 generates a c x p parity check matrix H, where a value c is a number of columns and length of a codeword and a value p is a number of rows and length of parity data, in operation 501.

The column permutator 220 reorders the columns of the matrix H from left to right in the order of highest entry of an element having a value of one in each column, resulting in a reordered parity check matrix H', in operation 502.

The triangular matrix generator 230 determines a cross-point I of the diagonal line L1 of the reordered parity check matrix H' and the diagonal line L2 of the parity matrix part, in operation 503.

In operation 504, a triangular matrix T is generated by exchanging columns of the reordered parity check matrix H', in accordance with the positions of elements having a value of one of all the rows above a horizontal line L3 that pass the cross-point I.

A first column exchange is performed between a left-most column of a message matrix part Mm and a left-most column of a parity matrix part Mp.

That is, referring to FIG. 3C, a column C1 of the message matrix part Mm and a column Cx of the parity matrix part Mp are exchanged.

Then, a second most left column C2 of the message matrix part Mm and a second most left column Cx−1 are exchanged. Similar column exchanges are sequentially performed on the remaining columns.

In operation 505, it is determined whether a row, under the horizontal line L3, in which a second element from right to left having a value of one is to the left of the diagonal line L2.

If such a row exists in, the triangular matrix extender 240 performs a plurality of row and column exchanges (permutations), thereby diagonalizing an un-diagonalized matrix C to the maximum extent in operations 506 and 507.

In other words, in operation 506, of all the rows under the horizontal line L3, a row in which a second most right element having a value of one of all elements having a value of one in the row is to the left of the diagonal line L2, is extracted, and then, the extracted row, e.g., R3 of FIG. 4B is exchanged with a top-most row, e.g., R1 under the line L3.

Thereafter, in operation 507, a column Cq on the right of the diagonal line L2, which has an element having a value of one corresponding to the extracted row, e.g., R3, is exchanged with a column Cp on the left of the diagonal line L2, which has an element having a value of zero corresponding to the extracted row, e.g., R3.

In a similar way, row and column permutations are repeatedly performed in operation 508.

As such, a parity check matrix including a triangular matrix is regenerated in operation 509.

In operation 510, the backward-substitution calculator 250 performs a backward-substitution calculation using message bits and the area of the triangular matrix extended by the triangular matrix extension unit 240, thereby obtaining parity data, and the lower part parity calculator 260 obtains parity bit's values (parity data) of an un-diagonalized part according to Gaussian elimination or equation (1).

In such a method according to an aspect of the present invention, the computations required to generate parity data are reduced, thereby efficiently obtaining the parity data.

According to other aspects of the invention, the calculator, or other unit of the apparatus, is a computer implementing the method shown in FIG. 5 using data encoded on a computer-readable medium.

Although a few embodiments of the present invention have been shown and described, it would be appreciated by those skilled in the art that changes may be made in this embodiment without departing from the principles and spirit of the invention, the scope the scope of which is defined in the claims and their equivalents.

What is claimed is:

1. A method of generating parity data based on a parity check matrix H having p codewords of length c, each codeword being divided into a message word of length m and parity data of length p, the method comprising:
   reordering a plurality of columns of the parity check matrix H based on elements in each of the columns having values of one to generate a reordered parity check matrix H';
   determining a cross-point I between a diagonal line L2 of a parity matrix part Mp in the parity check matrix H' and a reordered diagonal line L1 defined by a first entry of an element having a value of one in each column of the reordered parity check matrix H';
   performing column permutations on the reordered parity check matrix H' on the basis of positions of elements having a value of one in rows above a horizontal line L3 that passes through the cross-point I to generate a triangular matrix T;
   calculating values using the triangular matrix T and the message words to obtain a first part of the parity data; and
   satisfying the equation Hx=0, where x is a codeword matrix, to obtain a remaining second part of the parity data.

2. The method of claim 1, wherein the reordering a plurality of columns of the parity check matrix H comprises:
   finding a first entry of an element having a value of one in each column in the parity check matrix H; and reordering the columns from left to right in the order of highest entry of an element having a value of one 1 in each column.

3. The method of claim 1, wherein the determining a cross-point I comprises sequentially exchanging, with respect to a horizontal line L3, from left to right columns of a message matrix part Mm with columns of the parity matrix part Mp in the reordered panty check matrix H'.

4. The method of claim 1, wherein the calculating values using the triangular matrix T is performed by a backward-substitution method.

5. The method of claim 1, wherein the satisfying the equation Hx=0 is performed by a Gaussian elimination method.

6. A method of generating parity information based on a parity check matrix H having p codewords of length c, each codeword being divided into a message word of length m and parity data of length p, the method comprising:
reordering columns in the parity check matrix H based on elements in each column having values of one to obtain a reordered parity check matrix H';
determining a cross-point I between a diagonal line L2 of a parity matrix part Mp that corresponds to a parity information part in the parity check matrix H' and a reordered diagonal line L1 defined by a first entry of an element having a value of one in each column of the reordered parity check matrix H';
performing column permutations on the reordered parity check matrix H' on the basis of positions of elements having a value of one in rows above a horizontal line L3 that passes through the cross-point I to form a triangular matrix T; and
performing row and column permutation for rows under the horizontal line L3 based on the positions of elements having a value of one in the rows under the horizontal line L3 to form an extended triangular matrix T; and
calculating values using the extended triangular matrix T and the message words to obtain the parity data.

7. The method of claim 6, wherein the performing row and column permutations comprises:
checking whether there is a row under the horizontal line L3 having a second element from right to left having a value of one to the left of the diagonal line L2 of the parity matrix part Mp in the reordered parity check matrix H';
exchanging the row under the horizontal line L3 having a second element from right to left having a value of one to the left of the diagonal line L2 with a top-most row under the horizontal line L3; and
exchanging a first column having an element having a value of one in the newly exchanged top-most row on the right of the diagonal line L2 with a second column having an element having a value of one in the newly exchanged top-most row on the nearest left of the diagonal line L2.

8. The method of claim 7, wherein the operations are repeatedly performed until a row no longer exists having a second element from right to left having a value of one to the left of the diagonal line L2.

9. The method of claim 6, wherein the calculating values using the extended triangular matrix T comprises generating a part of the parity data using the extended triangular matrix and the message words.

10. The method of claim 9, wherein the generating a part of the parity data is performed by backward-substitution calculation.

11. The method of claim 6, wherein the calculating values using the extended triangular matrix T comprises generating remaining parts of parity data by Gaussian elimination.

12. An apparatus for generating parity information based on a parity check matrix H having p codewords of length c, each codeword being divided in a message word of length m and parity data of length p, the apparatus comprising:
a parity check matrix generator reordering columns in the parity check matrix H, based on elements in each column having elements with a value of one to generate a reordered parity check matrix H';
a triangular matrix generator for determining a cross-point I between a diagonal line L2 of a parity matrix part Mp in the parity check matrix H' and a reordered diagonal line L1 defined by a first entry of an element having a value of one in each column of the reordered parity check matrix H', and, on the basis of positions of elements having a value of one in rows above a horizontal line L3 that passes through the cross-point I to perform column permutations on the reordered parity check matrix H', to generate a triangular matrix T;
a calculator calculating values using the triangular matrix T and the message words to obtain a first part of the parity data; and
a calculator calculating values satisfying the equation Hx=0, where x is a codeword matrix, to obtain a remaining second part of the parity data.

13. The apparatus of claim 12, wherein the parity check matrix generator comprises:
a calculator to find a top position of each element having a value of one for each column in the parity check matrix H; and
a column permutator to reorder columns from left to right in the order of the highest entry of an element having a value of one for each column.

14. The apparatus of claim 12, wherein the triangular matrix generator sequentially exchanges from left to right columns of a message matrix part Mm with columns of the parity matrix part Mp in the reordered parity check matrix H', with for elements above the horizontal line L3.

15. The apparatus of claim 12, wherein the calculator calculating values using the triangular matrix T and the message words generates parity data by a backward-substitution calculation.

16. The apparatus of claim 15, wherein the triangular matrix generator generates the parity data by a Gaussian elimination.

17. An apparatus for generating parity information based on a parity check matrix H having p codewords of length c, each codeword being divided into a message word of length m and parity data of length p, the apparatus comprising:
a parity check matrix generator reordering columns in the parity check matrix H, based on elements in each column having values of one to generate a reordered parity check matrix H';
a triangular matrix generator determining a cross-point I between a diagonal line L2 of a parity matrix part Mp in the parity check matrix H and a reordered diagonal line L1 defined by a first entry of an element having a value of one in each column of the reordered parity check matrix H', and, on the basis of positions of elements having a value of one in rows above a horizontal line L3 that passes through the cross-point I to perform column permutations on the reordered parity check matrix H', to generate a triangular matrix T;
a column permutator to permutate rows and columns based on the positions of elements having a value of one in the rows to form an extended triangular matrix T, for rows under the horizontal line L3; and a calculator calculating values using the extended triangular matrix T and the message words to generate the parity data.

18. The apparatus of claim 17, wherein the column permutator comprises:

a checker checking whether there is a row under the horizontal line L3, in which a second element from right to left having a value of one is to the left of the diagonal line L2 of the panty matrix part Mp in the reordered parity check matrix H';

a first exchanger exchanging the row under the horizontal line L3, in which a second element from right to left having a value of one is to the left of the diagonal line L2 with a top-most row under the horizontal line L3; and a second exchanger exchanging a first column having an element having a value of one in the newly exchanged top-most row on the right of the diagonal line L2 with a second column having an element having a value of one in the same top-most row on the nearest left of the diagonal line L2.

19. The apparatus of claim 17, wherein the calculator calculating values using the extended triangular matrix T generates part of the parity data by a backward substitution calculation using the extended triangular matrix and the message words.

20. The apparatus of claim 17, wherein the calculator calculating values using the extended triangular matrix T generates the remaining parity data by Gaussian elimination.

21. A method of generating parity data, the method comprising:

reordering a plurality of columns of a parity check matrix based on values of elements in the columns to generate a reordered parity check matrix;

determining a cross-point between a diagonal line through the parity matrix portion of the parity check matrix and a reordered diagonal line defined by values of elements in each column of the reordered parity check matrix;

performing column permutations on the reordered parity check matrix according to positions of elements relative to a horizontal line that passes through the cross-point to generate a triangular matrix; and calculating values using the triangular matrix and message words to obtain the parity data.

22. The method according to claim 21, wherein the reordering a plurality of columns comprises:

finding an entry of an element having a first value in each column in the parity check matrix; and reordering the columns on the basis of a position of elements having the first value in each column.

23. The method according to claim 21, the determining a cross-point comprises sequentially exchanging with respect to a horizontal line through the matrix from columns of a message matrix part with columns of the parity matrix part in the reordered parity check matrix.

24. The method according to claim 21, wherein the calculating values using the triangular matrix is performed by a backward-substitution method.

25. The method according to claim 21, wherein part of the parity data is found by a Gaussian elimination.

26. A method of generating parity information, comprising:

reordering columns in a parity check matrix based on values of elements in each column to obtain a reordered parity check matrix;

determining a cross-point between a diagonal line of a parity matrix part that corresponds to a parity information part in the parity check matrix and a reordered diagonal line defined by a position of an element having a first value in each column of the reordered panty check matrix;

performing column permutations on the reordered parity check matrix on the basis of positions of elements having a second value relative to a horizontal line that passes through the cross-point to form a triangular matrix;

performing row and column permutation to form an extended triangular matrix; and calculating values using the extended triangular matrix and message words to obtain the parity data.

27. The method of claim 26, wherein the performing row and column permutations comprises:

checking whether there is a row relative to the horizontal line having an element with a first value in a first position relative to the diagonal line of the parity matrix portion in the reordered parity check matrix;

exchanging the checked row with a top-most row under the horizontal line; and exchanging a first column having an element having the first value in the exchanged top-most row with a second column on the opposite side of the diagonal line having the first value in the exchanged top-most row.

28. The method according to claim 26, wherein the calculating values using the extended triangular matrix comprises generating a part of the parity data using the extended triangular matrix and the message words.

29. The method of claim 26, wherein the generating a part of the parity data is performed by backward-substitution calculation.

30. The method according to claim 26 wherein part of the data is generated by Gaussian elimination.

* * * * *

UNITED STATES PATENT AND TRADEMARK OFFICE
CERTIFICATE OF CORRECTION

PATENT NO. : 7,278,082 B2  Page 1 of 1
APPLICATION NO. : 10/765278
DATED : October 2, 2007
INVENTOR(S) : Ki-hyun Kim et al.

It is certified that error appears in the above-identified patent and that said Letters Patent is hereby corrected as shown below:

Title Page, Item (57) Abstract, line 2, change "panty" to --parity--.

Column 9, line 8, change "panty" to --parity--.

Column 9, line 32, delete "and".

Column 11, line 11, change "panty" to --parity--.

Column 12, line 20, change "panty" to --parity--.

Signed and Sealed this

Eleventh Day of December, 2007

JON W. DUDAS
*Director of the United States Patent and Trademark Office*